US007268004B2

(12) United States Patent
Lee

(10) Patent No.: US 7,268,004 B2
(45) Date of Patent: Sep. 11, 2007

(54) THERMOELECTRIC CONTROL FOR FIELD EMISSION DISPLAY

(75) Inventor: John K. Lee, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 886 days.

(21) Appl. No.: 10/342,406

(22) Filed: Jan. 13, 2003

(65) Prior Publication Data

US 2003/0137474 A1 Jul. 24, 2003

Related U.S. Application Data

(62) Division of application No. 09/306,205, filed on May 6, 1999, now Pat. No. 6,507,328.

(51) Int. Cl.
*H01L 21/00* (2006.01)
*H01J 1/02* (2006.01)
*H01J 1/16* (2006.01)
*G09G 3/10* (2006.01)

(52) U.S. Cl. ........................ 438/20; 313/309; 313/336; 315/169.1

(58) Field of Classification Search .................. 438/20, 438/479, 584; 313/309, 336; 315/169.1; 257/10, 930, E23.082
See application file for complete search history.

(56) References Cited

U.S. PATENT DOCUMENTS 3,970,887 A 7/1976 Smith et al.
5,075,596 A 12/1991 Young et al.
5,186,670 A 2/1993 Doan et al.
5,212,426 A * 5/1993 Kane ........................ 315/169.1
5,229,331 A 7/1993 Doan et al.
5,391,259 A 2/1995 Cathey et al.
5,572,041 A * 11/1996 Betsui et al. ................. 257/10
5,587,128 A 12/1996 Wilding et al.
5,710,478 A * 1/1998 Kanemaru et al. .......... 313/336
5,721,472 A 2/1998 Browning et al.
5,770,919 A 6/1998 Tjaden et al.
5,909,200 A 6/1999 Hush
5,910,792 A 6/1999 Hansen et al.
5,970,719 A 10/1999 Merritt
6,034,480 A 3/2000 Browning et al.
6,060,823 A * 5/2000 Okamoto et al. ........... 313/309

OTHER PUBLICATIONS

U Birkholz et al., "Fast semiconductor thermoelectric devices", Sensors and Actuators, vol. 12, pp. 179-184 (1987).

(Continued)

*Primary Examiner*—Shouxiang Hu
(74) *Attorney, Agent, or Firm*—Wells St. John, P.S.

(57) ABSTRACT

An active matrix display that does not require a transistor or similar current switching device at each pixel. Instead, the display employs in each pixel a temperature-controlled current source that provides to the field emitters of the pixel an amount of electrical current which varies in response to the temperature of a temperature sensor. Each pixel further includes a thermoelectric heat transfer circuit which transfers heat to or from the sensor in an amount which varies in response to the video signal. Consequently, the video signal controls the temperature of the sensor within a pixel's temperature-controlled current source, which controls the current flow through the pixel's field emitters.

5 Claims, 4 Drawing Sheets

OTHER PUBLICATIONS

Fink, editor, "Electronic Engineers Handbook", McGraw Hill, article entitled "Electronic Energy Conversion Methods" at pp. 27.2-27.12 (1975).

A. Hochbaum, "Thermally addressed smectle liquid crystal displays", Optical Engineering, vol. 23, No. 3, pp. 253-260 (1984).

L.A. Johnson, "Controlling temperatures of diode lasers and detectors thermoelectrically", Lasers and Optronics, Apr. 1988, pp. 109-114.

Lu and Davies, "Thermally and electrically addressed dye switching LCSs", Mol. Cryst. Liq. Cryst., vol. 94, pp. 167-189 (1983).

* cited by examiner

THERMOELECTRIC CONTROL FOR FIELD EMISSION DISPLAY

CROSS REFERENCE TO RELATED APPLICATION

This patent application is a divisional of application Ser. No. 09/306,205 filed May 6, 1999, now U.S. Pat. No. 6,507,328.

RELATED PATENT DATA

This patent resulted from a divisional application of and claims priority to U.S. patent application Ser. No. 09/306,205, filed May 6, 1999, entitled "Thermoelectric Control for Field Emission Display", naming John K. Lee as inventor, now U.S. Pat. No. 6,507,328 which issued on Jan. 14, 2003, the disclosure of which is incorporated by reference.

This invention was made with Government support under Contract No. DABT63-93-C-0025 awarded by Advanced Research Projects Agency (ARPA). The Government has certain rights in this invention.

FIELD OF THE INVENTION

This invention relates generally to field emission displays, and, more specifically, to a method and apparatus for controlling the brightness of a pixel by controlling the temperature of a temperature sensor in the pixel.

BACKGROUND OF THE INVENTION

In field emission displays, fast response time and high contrast are best achieved by active matrix designs—i.e., designs that employ a current switching device, conventionally one or more transistors, at each pixel of the display.

Conventional active matrix displays are fabricated on either a silicon substrate or a dielectric (typically glass) substrate.

An active matrix flat panel display having transistors fabricated from single-crystal silicon on a silicon substrate currently is feasible only for small displays. For a display area larger than several square centimeters, it is impractical to produce such a large transistor array without excessive defects, and such a large silicon substrate is undesirably fragile.

An active matrix flat panel display having thin film transistors (TFT's) fabricated on a glass substrate is much more suitable for a large area display. Such TFT designs are conventionally used for liquid crystal displays because they overcome the stated shortcomings of displays fabricated on silicon substrates. However, TFT designs are much less suitable for field emission displays, because thin film transistors typically have much higher leakage current than single-crystal silicon transistors. This leakage current is acceptable for liquid crystal displays, but not for field emission displays, because the latter are current-controlled rather than voltage-controlled and typically have time-averaged pixel currents on the order of only $10^{-8}$ ampere or less.

Accordingly, there is a need for a field emission display that overcomes the shortcomings of single-crystal transistor arrays on silicon substrates and TFT arrays on dielectric substrates.

SUMMARY OF THE INVENTION

The invention is an active matrix display that does not require a transistor or similar current switching device at each pixel. Instead, the display employs in each pixel a temperature-controlled current source which provides to the field emitters of the pixel an amount of electrical current that varies in response to the temperature of a temperature sensor. Each pixel further includes a thermoelectric heat transfer circuit which transfers heat to or from the sensor in an amount that varies in response to the video signal. Consequently, the video signal controls the temperature of the sensor within a pixel's temperature-controlled current source, which controls the current flow through the pixel's field emitters.

DETAILED DESCRIPTION OF THE PREFERRED EMBODIMENTS

Figure 1:
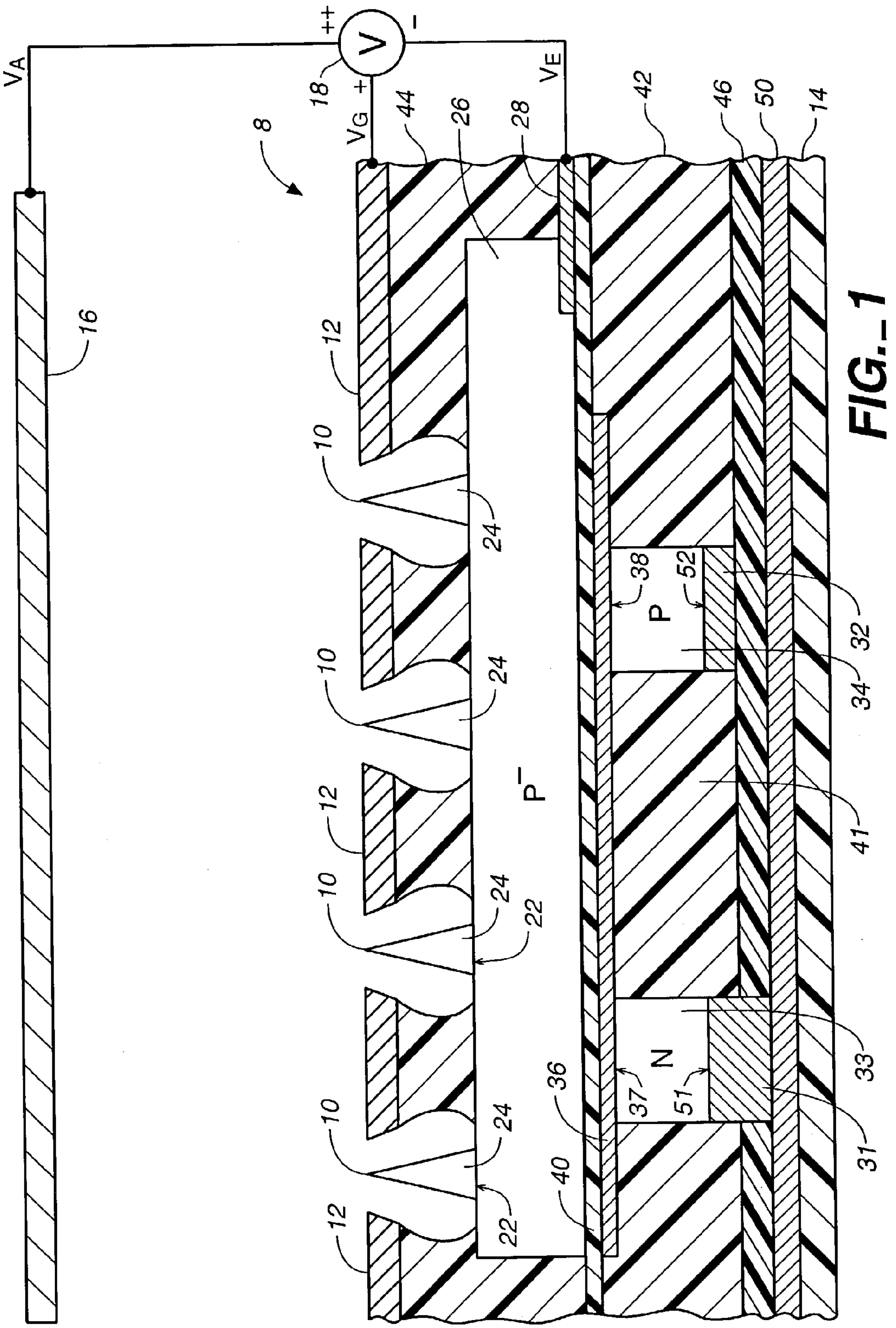
FIG. 1 is a schematic, sectional view of one pixel of the presently preferred embodiment of the display of the invention.
Figure 2:
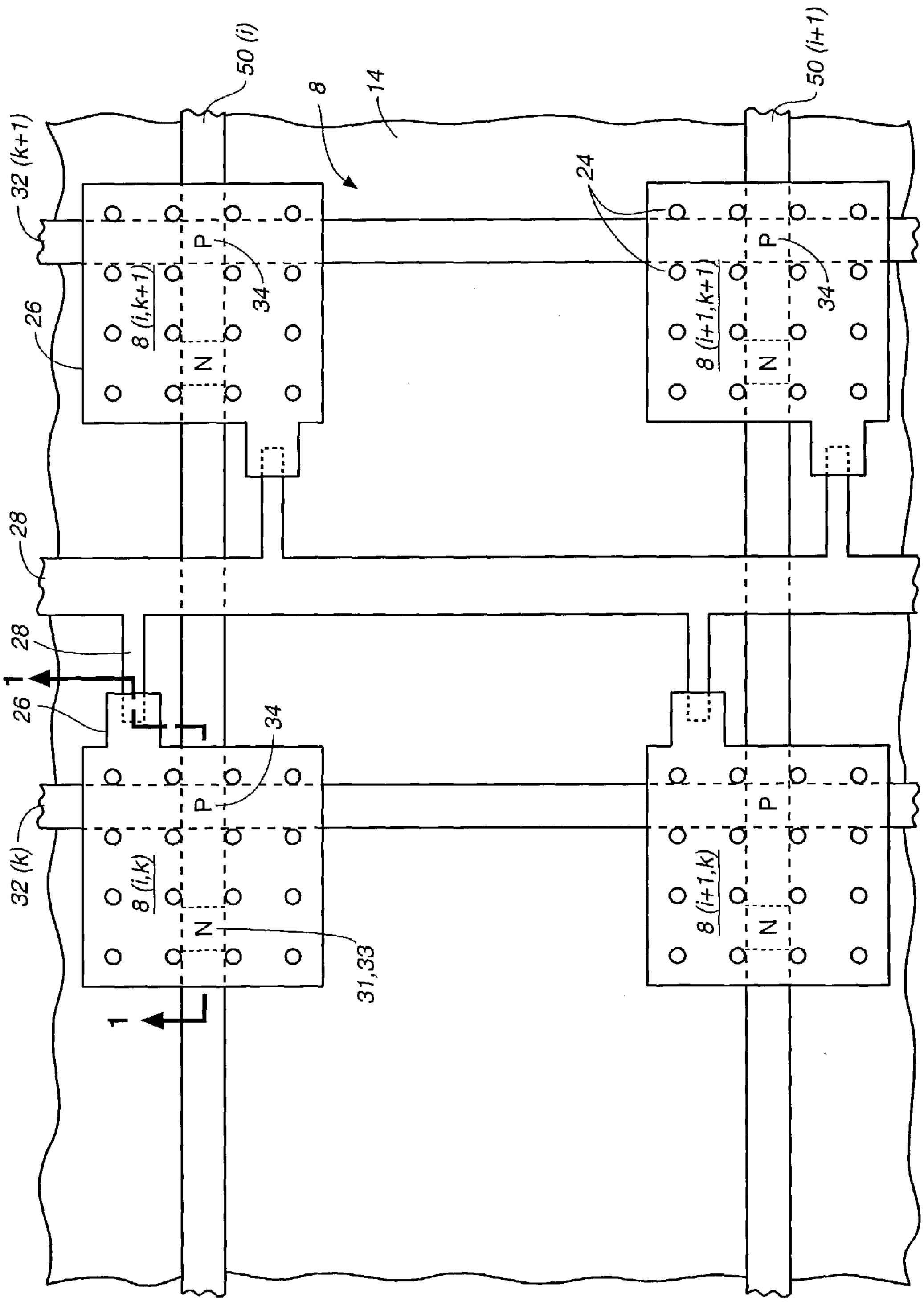
FIG. 2 is a schematic, plan view of four pixels of the embodiment of FIG. 1.

FIGS. 1 and 2 show the presently preferred embodiment of the field emission display of the invention. The display includes a plurality of pixel circuits 8 fabricated on a substrate 14. The pixel circuits 8 are arranged in a matrix or array of rows and columns as shown in FIG. 2. Each row is associated with a distinct row conductor line 50 which connects to each pixel circuit in that row, and each column is associated with a distinct column conductor line 32 which connects to each pixel circuit in that column.

In FIG. 2, the pixel located at the intersection of the i-th row and the k-th column of the matrix is denoted 8($i$, $k$), the i-th row conductor is denoted 50($i$), and the k-th column conductor is denoted 32($k$). A display suitable for use as a computer or television monitor would include at least 100,000 pixels arranged in an array having at least hundreds of rows and columns. FIG. 2 illustrates just a small portion of the display: two rows, two columns, and four pixels.

Each pixel circuit 8 includes a number of field emitter tips 10 and at least one grid electrode 12. In the preferred embodiment, a single grid electrode 12 is common to all the pixel circuits of the display. Each field emitter tip is adjacent an aperture of the grid electrode. To simplify the drawings, each pixel is depicted as having only sixteen emitter tips, and the size of each emitter tip is exaggerated. A display large enough to be used as a computer or television monitor would have about a thousand emitter tips in each pixel.

Each field emitter tip 10 preferably is the sharp apex of a cone-shaped field emitter base 24 formed of electrically conductive material such as doped semiconductor material. To reduce the grid-to-emitter voltage required to induce field emission from the field emitter tip, the field emitter base or cone 24 may be coated with a low work function material, not shown. Examples of low work function materials, and processes for fabricating the field emitter tips and gate electrode, are described in commonly assigned U.S. Pat. Nos. 5,186,670 and 5,229,331, both to Doan et al., the entire contents of each of which are hereby incorporated by reference into this patent specification.

An anode electrode 16 is separated from the grid electrode by dielectric spacers, not shown. The anode is transparent and has an cathodoluminescent coating on its inner surface, facing the field emitters.

A power supply 18 provides a relatively negative cathode voltage $V_E$ to the field emitters, a more positive voltage $V_G$ to the grid, and a much more positive voltage $V_A$ to the anode. Typically, $V_E$ approximately equals electrical ground potential, i.e., zero volts. The difference between the grid voltage $V_G$ and the more negative voltage at the field emitters must be great enough to induce field emission of electrons from the outer surface of the field emitters. Because the anode voltage $V_A$ is much more positive than the grid voltage $V_G$, almost all the electrons emitted from the field emitter tips are accelerated past the grid electrode and strike the cathodoluminescent coating on the anode electrode, causing the coating to emit light. The brightness of the emitted light is proportional to the current flow through the field emitters.

The just described components of the display are conventional, but the remaining components are unique to the invention.

In each pixel, the current flow through the field emitter tips 10 is regulated by a temperature-controlled current source. In the preferred embodiment, the temperature-controlled current source in each pixel comprises a plurality of reverse-biased PN junctions 22, there being one PN junction for each emitter tip. Each PN junction is connected between its corresponding field emitter 10 and the negative terminal $V_E$ of the power supply 18.

To form the PN junctions, each pixel includes a $P^-$ doped semiconductor cathode layer 26 underlying the $N^+$ field emitter bases or cones of that pixel. The $P^-$ cathode layer extends across the lateral area of the pixel so as to contact, and form a PN junction 22 with, the bottom surface of each of the $N^+$ field emitter cones 24 in the pixel. A power supply cathode bus conductor 28 connects the $P^-$ doped cathode layer to the cathode voltage $V_E$ that is negative relative to the grid voltage $V_G$, thereby reverse biasing each PN junction.

It is well known that the current through a reverse-biased PN junction (called the saturation current) is an exponential function of temperature. Because each reverse-biased PN junction 22 is connected in series between its corresponding field emitter tip 10 and the power supply voltage $V_E$, the PN junction regulates the current through that field emitter tip as a function of the temperature of the PN junction. Increasing the temperature of each PN junction in a pixel will increase the current through the field emitter tips of the pixel, thereby increasing the brightness of that pixel in the display. Therefore, the reverse-biased PN junctions 22 in each pixel collectively function as a temperature sensor.

Each pixel additionally includes a thermoelectric heat transfer circuit to adjust the temperature of the temperature sensor of the pixel (i.e., PN junctions 22) in response to a video signal, thereby adjusting the brightness of the pixel. In the preferred embodiment, the thermoelectric heat transfer circuit is a conventional Peltier thermocouple cooling device (i.e., heat pump) that pumps heat away from the temperature sensor of the pixel in response to the video signal. Alternatively, a conventional resistive heating device could be used to supply heat to the temperature sensor of the pixel in response to the video signal.

The Peltier thermocouple cooling device consists of first and second oppositely doped semiconductor regions 33, 34 called the two "legs" of the thermocouple, plus an overlying metal layer 36 called the "bridge" electrode. The bridge electrode 36 extends between, and electrically and thermally connects, the top surfaces of the two legs at first and second ohmic junctions 37, 38. The first and second legs 33 and 34 are doped as N type and P type semiconductors, respectively.

Peltier thermocouples, including choice of materials and geometry for maximum efficiency, are described in detail in the following publications, the entire contents of which are hereby incorporated by reference into this patent specification: Fink, editor, "Electronic Engineers Handbook", McGraw Hill, pages 27.2–27.12 (1975); U. Birkholz et al., "Fast semiconductor thermoelectric devices", Sensors and Actuators, vol. 12, pages 179–184 (1987); and L. A. Johnson, "Controlling temperatures of diode lasers and detectors thermoelectrically", Lasers and Optronics, April 1988, pages 109–114.

Although the above-referenced publications describe the design, fabrication, and operation of Peltier thermocouples in detail, the basic principles can be summarized as follows.

An electrical conductor or semiconductor material can be characterized by a Peltier coefficient which is proportional to the heat carrying capacity of the conduction electrons of the material. For P type semiconductors, where electrical current is conducted by holes, the Peltier coefficient has a sign opposite that of N type semiconductors and most metals in which current is conducted by electrons. Lightly doped semiconductors generally used in the legs of a Peltier thermocouple have Peltier coefficients 100 times greater than the Peltier coefficients of metals. Therefore, the Peltier coefficient of the metal bridge can be considered zero.

If electrical current flows from a first material to a second material, and if the Peltier coefficient of the second material is more positive than that of the first material, then the junction between the two materials will absorb heat, i.e., it will be cooled. At junction 37, the first material is the N leg 33 having a negative Peltier coefficient, and the second material is the metal bridge 36 having an essentially zero Peltier coefficient, which is more positive than the negative coefficient of the N leg. Similarly, at junction 38, the first material is the metal bridge 36 and the second material is the P leg 34 having a positive Peltier coefficient. Therefore, if a voltage is applied between the respective lower surfaces of the N type leg 33 and the P type leg 34 of a pixel so as to produce a positive current flow up the N leg 33, through the first junction 37, across the metal bridge 36, through the second junction 38, and down the P leg 34, then both of the junctions 37, 38 will be cooled. This, in turn, will cool the temperature sensor (reverse-biased PN junctions 22) of the pixel, which will decrease the current through field emitter tips 10 and hence decrease the pixel brightness.

The substrate 14 functions a heat sink so that its temperature remains fairly constant, approximately equal to that of the ambient environment. The dielectric layer 46 should be thin enough to provide a thermal resistance between the heat sink and the lower surfaces 37, 38 of the two legs 33, 34 that is substantially less than the thermal resistance between the upper and lower surfaces of each leg. This will maintain the temperature of the lower surfaces of the two legs close to the temperature of the heat sink (substrate 14). Consequently, the temperature of the metal bridge electrode 36, and hence the temperature of the temperature sensor 22, will be determined primarily by the amount of cooling produced by the Peltier thermocouple.

In the preferred embodiment, the row conductors 50 and the column conductors 32 supply the electrical current that powers the Peltier thermocouples. Specifically, in the pixel 8(*i, k*) located at the i-th row and the k-th column of the display, the i-th row conductor 50(*i*) connects to the lower surface of the N type leg 33 through metal contact 31, and the k-th column conductor 32(*k*) connects to the lower surface of P type leg 34. Therefore, in order for the thermocouples to produce cooling, the voltage on the row conductors should be positive relative to the voltage on the column conductors.

The column conductors 32 are either highly doped semiconductor material or, much more preferably, metal. In either case, the Peltier coefficients of metal contacts 31 and column conductors 32 are close to zero. In response to electrical current flow from the row conductor 50 to the column conductor 32, the junction 51 between the N leg 33 and the metal contact 31 will release heat, and the junction 52 between the P leg 34 and the column conductor 32 will release heat, because the current flow across both junctions is from a material having a higher Peltier coefficient to a material having a lower Peltier coefficient. The heating of the lower junctions 51, 52 could offset to some extent the cooling at the upper junctions 37, 38, but this offset will be negligible if the thermal resistance of the dielectric layer 46 to vertical heat flow is sufficiently low as described above.

In the preferred embodiment, the output of a variable voltage source or current source (not shown) whose output varies in response to the video or luminance signal for a pixel 8(*i, k*) is applied between the row conductor line 50(*i*) and the column conductor line 32(*k*) associated with that pixel. This can be accomplished by a conventional video detector circuit (not shown) that activates each row line sequentially, and that applies to the k-th column line a voltage or current source output that varies in response to the desired luminance of the k-th pixel in the currently activated row. A suitable video detector (including row and column driver circuits) is described in U.S. Pat. No. 5,075,596 to Young et al., the entire contents of which are hereby incorporated by reference into this patent specification.

"Activating" a row line means completing a path for current to flow back to the variable voltage or current source. In the preferred embodiment, each column line 32 spans all rows of the display. Therefore, only one row line 50 should be active at a time. When a row line is inactive, the video detector circuit disconnects or opens the path so that no current can flow to the thermocouples in that row.

If the temperature sensor has a positive temperature coefficient so that the field emission current increases with temperature, as is true for the PN junctions 22 of the preferred embodiment, then the voltage or current that the variable current source applies to each pixel should be logically inverted; i.e., the voltage or current applied across the thermocouple of each pixel should decrease in proportion to the desired brightness of that pixel.

One suitable implementation would be to apply a fixed voltage $V_2$ to whichever row line currently is active, and to apply to each column line a voltage ranging between $V_1$ and $V_2$ corresponding to a range of intended pixel brightness between minimum and maximum, where $V_2>V_1$. For maximum pixel brightness, a voltage of $V_2$ would be applied to the column line, so that the voltage applied between the two legs of the thermocouple of that pixel would be zero, hence the thermocouple would not cool the PN junctions 22, and hence the temperature of the PN junctions and the field emission current would be maximized. For minimum pixel brightness, a voltage of $V_1$ would be applied to the column line, so that the voltage applied between the two legs of the thermocouple of that pixel would be the maximum possible value of $(V_2-V_1)$, hence the thermocouple would produce a maximum rate of cooling of the PN junctions 22, and hence the temperature of the PN junction and the field emission current would be minimized.

The preceding description assumes the Peltier thermocouples function as cooling devices. If the polarity of the variable voltage or current is reversed, then the thermocouples will release heat in proportion to the applied current. Such an implementation also will work, but using a Peltier thermocouple for controllable heating rather than controllable cooling generally is less efficient than using a resistive heater, because, as described in the above-referenced publication by Johnson, the Peltier thermocouple dissipates substantial power in resistive heating of the legs. In fact, as stated earlier, simple resistive heating can be used instead of a Peltier thermocouple as a controllable heat transfer device. However, for the extremely low currents employed in field emission displays (time-average currents of $10^{-8}$ ampere or less), cooling the PN junctions 22 to controllably reduce the field emission current is likely to be more practical than heating the PN junctions to controllably increase the current.

As described in the above-referenced publications by Fink, Birkholz and Johnson, the efficiency of the thermocouple is a function of the material of which the two legs 33, 34 are composed. The material should have a large magnitude Peltier coefficient and a high ratio of electrical conductivity to thermal conductivity. The material generally recognized as maximizing the efficiency of the thermocouple is bismuth telluride semiconductor that is lightly doped as N type and P type in the respective legs 33 and 34.

These three publications also discuss optimizing the length and cross-sectional area of the legs 33, 34 of the thermocouple.

A dielectric layer 40 electrically isolates the $P^-$ cathode region 26 from the thermocouple bridge electrode 36. To maximize heat transfer from the thermocouple 33–38 to the temperature sensor (PN junctions 22), the dielectric 40 preferably has low thermal resistance in the vertical direction and low thermal mass, which means it should be a material having high thermal conductivity and low thermal mass, and it should be no thicker than necessary for electrical isolation. However, it must be thick enough to prevent electrical breakdown in response to the maximum voltage difference between the P-cathode region 26 and the bridge electrode 36. The same considerations apply to the dielectric 46 that separates the row conductors 50 from the column conductors 32, so as to minimize thermal resistance between the lower surfaces 51, 52 of the thermocouple legs and the substrate 14. The dielectric 46 is included to permit the column lines to cross over the row lines without electrical contact, as shown in FIG. 2.

Dielectric material 41 occupies the space between the P and N regions 33, 34 of the Peltier device. It preferably has low thermal conductivity to maximize the temperature differential between the bridge electrode 36 and the substrate 14 in response to the variable current applied to the thermocouple. Additional dielectric material 42, 44 laterally separates adjacent pixels from each other. It also should have low thermal conductivity to maximize thermal isolation between pixels, so that the temperature (and hence brightness) of one pixel will not noticeably affect the temperature (and hence brightness) of an adjacent pixel.

The cathode bus conductor 28 can undesirably conduct heat between adjacent pixels. To minimize such heat transfer, the cathode bus preferably comprises wide main portions 28*a* that span the entire width of the display (parallel to either the X or Y axis) and much thinner transverse branch portions 28*b* that connect each pixel to the main portion 28*a*. The main portions 28*a* extend along every alternate column of the dielectric 42, 44, and they are wide and deep enough to conduct the field emission current with negligible resistive power dissipation, i.e., negligible voltage drop. Each branch portion 28*b* should be sufficiently thin in depth and narrow in width so that its thermal resistance is large enough to prevent the heat transfer between the cathode layers 26 of adjacent pixels from substantially reducing the intended temperature differential between pixels.

Some heat transfer between the cathode layers of adjacent pixels may be unavoidable. The consequence of such heat transfer would be a slight reduction in the sharpness of the displayed image. This can be corrected by subjecting the video signal to a conventional video signal processing circuit for boosting or exaggerating image sharpness before applying the video signal to the display pixels.

The $P^-$ doped semiconductor layer 26 in the temperature controlled current source preferably has high thermal conductivity so as to minimize the time required for heat transfer between each PN junction 22 and the corresponding thermoelectric heat transfer circuit 31–38. A preferred material for both the $P^-$ layer 26 and the $N^+$ layer 24 is germanium because it has relatively high thermal conductivity. In contrast, silicon is less preferred because it has lower thermal conductivity. However, silicon may be preferred from the standpoint of manufacturability, because silicon fabrication processes currently are more mature and extensively developed than germanium processes.

The substrate 14 can be a dielectric, a semiconductor, or a conductor. A currently preferred substrate for fabricating a large area flat panel display is a glass plate because of its strength and rigidity. As explained above, the substrate 14 preferably should be maintained at a substantially constant temperature. Merely exposing the substrate to the ambient atmosphere may provide sufficient temperature regulation. Alternatively, the substrate 14 can be thermally coupled to a heat sink or a temperature regulation apparatus.

Fabrication Process

Figure 4:
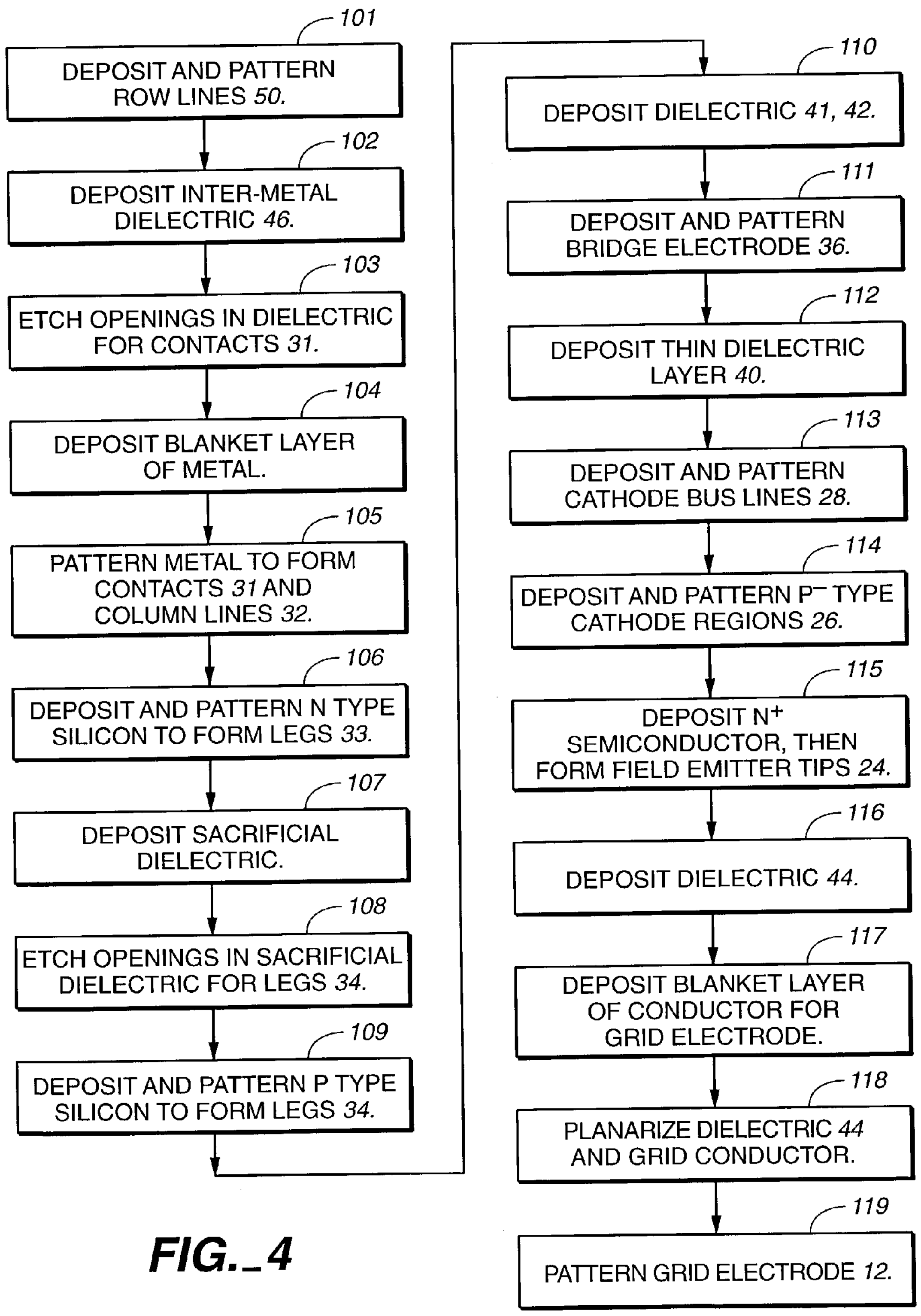
FIG. 4 is a flow chart of a process for manufacturing the display of the invention.

The field emission display shown in FIG. 1 can be manufactured by the following sequence of process steps. Each step can be performed by conventional semiconductor fabrication processes. (The step numbers 101–119 refer to the flow chart in FIG. 4.)

Step 101: Deposit and pattern the row conductor lines 50 on the substrate 14.

Step 102: Deposit an inter-metal dielectric layer 46 to cover the row address lines and the exposed surface of the substrate.

Step 103: Etch openings in the dielectric layer 46 at each location that is to be filled by a metal contact 31.

Step 104: Deposit a blanket layer of metal so as to cover the dielectric 46 and fill the openings created in the preceding step.

Step 105: Pattern the metal to form the contacts 31 and column conductor lines 32.

Step 106: Deposit a blanket layer of in situ doped N type polysilicon, then pattern it to form the N type legs 33 overlying the contacts 31.

Step 107: Deposit a blanket layer (not shown) of a "sacrificial" dielectric. The portion of the dielectric covering the N type legs is called "sacrificial" because it will be removed in the planarizing process of Step 110 after the P type legs are deposited. Its function is to protect the N type legs from contamination during the deposition of the P type legs.

Step 108: Etch openings in the sacrificial dielectric at the locations to be filled by the P type legs 34, so as to expose the portions of the column conductor lines 32 that underlie the intended locations of the P type legs (see FIG. 2).

Step 109: Deposit a blanket layer of in situ doped P type polysilicon, then pattern it to form the P type legs 34.

Step 110: Deposit dielectric 41, 42 to a depth sufficient to fill all the spaces between the legs 33, 34 of the Peltier thermocouples, and so that the top surface of dielectric 41, 42 is coplanar with the top surfaces 37, 38 of the legs. Preferably, this step is performed by depositing the dielectric 41, 42 to a thickness slightly greater than the height of the legs 33, 34, and then removing the top surface of the dielectric by a planarizing process, such as chemical-mechanical polishing, so as to expose the top surfaces 37, 38 of the legs 33, 34.

Step 111: Deposit and pattern the Peltier bridge electrode 36.

Step 112: Deposit the thin dielectric layer 40.

Step 113: Deposit and pattern the cathode bus conductor lines 28. (See FIG. 2.)

Step 114: Deposit and pattern the $P^-$ type cathode regions 26.

Step 115: Deposit a layer of $N^+$ type semiconductor material, then perform masking and etching steps so as to form field emitter tips 24 from the $N^+$ material. Suitable masking and etching processes for fabricating field emitter tips are described in U.S. Pat. No. 3,970,887 to Smith et al. and commonly assigned U.S. Pat. No. 5,391,259 to Cathey et al. The entire contents of both patents are hereby incorporated by reference into this patent specification.

Step 116: Deposit dielectric 44 to a thickness such that the lowest point of the dielectric surface is approximately coplanar with the tips of the field emitters 10.

Step 117: Deposit a blanket layer of the electrically conductive material that will be patterned (in Step 119) to form the grid electrode 12.

Step 118: Planarize the dielectric 44 and the grid electrode material so that the top surface of the grid electrode material is approximately coplanar with the tips of the field emitters 10. Suitable planarization processes using chemical-mechanical polishing are described in the above-referenced U.S. Pat. Nos. 5,186,670 and 5,229,331, both to Doan et al.

Step 119: Pattern the grid electrode 12 over the top surface of the dielectric 44.

Other process steps different from those just described also can be used to fabricate similar structures. For example, the N and P type legs 33, 34 of the Peltier thermocouple can be fabricated by ion implantation, rather than by deposition of in situ doped polysilicon as described in Steps 6–9.

Alternative Temperature-Controlled Current Source

Figure 3:
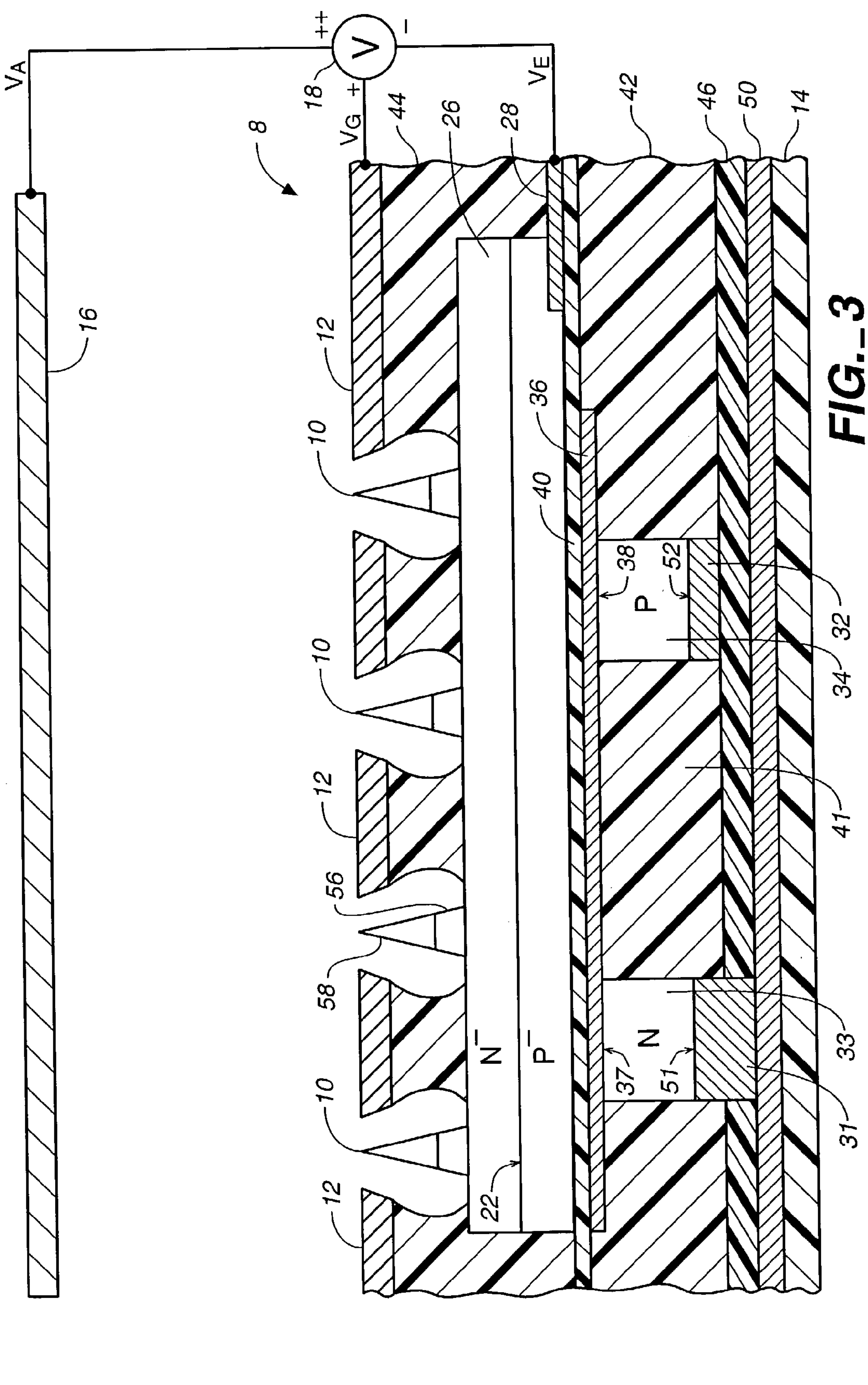
FIG. 3 is a schematic, sectional view of one pixel of an alternative embodiment in which the field emission current for a pixel is controlled by a single PN junction common to the entire pixel.

Other designs are possible for the temperature-controlled current source 22–26. The FIG. 1 embodiment includes a distinct PN junction 22 for each emitter tip 10. FIG. 3 shows an alternative embodiment in which each pixel includes only one PN junction 22 connected to all the emitter tips 10 in the pixel. Specifically, each pixel includes a single $N^+$ region 24 that overlies the entire area of the $P^-$ region 26 beneath the emitter tips in the pixel.

In the FIG. 3 design, the single PN junction 22 will control the total current through the field emitters in the pixel, but it will not ensure that this total current is equally apportioned among the individual field emitter tips 10 within the pixel.

In contrast, the FIG. 1 design provides a plurality of distinct, non-contiguous $N^+$ regions 24 between the $P^-$ region 26 and the respective field emitter tips 10. Accordingly, the current through each field emitter is individually controlled by a distinct PN junction 22 underlying that emitter tip.

In the FIG. 3 design, to more equally apportion the current through the field emitters within a pixel, each field emitter preferably includes a relatively high resistance layer 56 which functions as a resistor connected in series between the emitter tip and the PN junction 22. Optionally, the high resistance layer 56 in each field emitter underlies a lower resistance layer 58 in the field emitter. The fabrication of field emitters having such high and low resistance layers is described in detail in commonly-assigned U.S. Pat. No. 5,770,919 to Tjaden et al., the entire contents of which are hereby incorporated by reference into this patent specification.

Similarly, the emitter tips of the FIG. 1 design need not be composed of a monolithic material. The bottom portion of each emitter tip can be $N^+$ material to form the PN junctions 22 as described, and another material can be deposited over the $N^+$ material to form the top portion of each emitter tip. Such multi-layer tips can be fabricated by the same process steps described in the above-referenced Tjaden patent for fabricating tips having high and low resistance layers.

In another alternative implementation, the two semiconductor layers 24, 26 could be replaced by a single, lightly doped, semiconductor layer. A lightly doped semiconductor will have an electrical resistance with declines with increasing temperature, thereby conducting a current flow from the power supply 18 to the field emitters 10 which increases with increasing temperature.

In the illustrated preferred embodiment, the temperature-controlled current source consists of a temperature sensor (e.g., a reverse-biased PN junction 22) connected between a power supply 18 and the field emitters 10, the field emitter current flows through the temperature sensor. This is the simplest possible implementation. However, a more complex temperature-controlled current source is possible in which the temperature sensor, such as a reverse-biased PN junction, controls a separate current regulator (such as a transistor) connected between the power supply 18 and the field emitters.

Non-Display Applications

Although field emitters are most commonly used in flat panel displays, field emitters conventionally are also used in other current switching circuits. In any electrical circuit which includes field emitters, the present invention can be used to control the electron emission from the field emitters. The implementation and the operation of the invention would remain as described above, except that the field emitters need not be arranged in an array or matrix pattern as in a display, and the electrical signal applied across the first and second conductors of the Peltier device could be any electrical input signal rather than row and column address signals.

The invention claimed is:

1. A method of fabricating a field emission device, comprising the steps of:

forming a first N type semiconductor layer and a first P type semiconductor layer at different locations on a substrate;

forming a first conductor over the two semiconductor layers;

forming a first dielectric layer over the first conductor;

forming over the first dielectric layer a temperature sensitive material having an electrical characteristic which changes in response to temperature; and forming at least one field emitter tip in thermal communication with the temperature sensitive material.

2. A method according to claim 1, wherein the temperature sensitive material is a semiconductor material.

3. A method according to claim 1, wherein the step of forming a temperature sensitive material comprises:

forming a second P type semiconductor layer over the first dielectric: and forming a second N type semiconductor layer over the second P type layer.

4. A method according to claim 1, wherein:

the step of forming at least one field emitter tip comprises forming a plurality of field emitter tips; and the step of forming a temperature sensitive material comprises:

forming a second P type semiconductor layer over the first dielectric, and forming a plurality of distinct and non-contiguous N type semiconductor layers, each of which is formed between a respective one of the field emitter tips and the second P type layer.

5. A method according to claim 1, further comprising the steps of:

forming a row address conductor line connected to one of the first semiconductor layers; and forming a column address line connected to the other one of the first semiconductor layers which is not connected to the row address line.

* * * * *